US009341756B2

(12) United States Patent
Mueller et al.

(10) Patent No.: US 9,341,756 B2
(45) Date of Patent: May 17, 2016

(54) METHOD FOR CORRECTING THE SURFACE FORM OF A MIRROR

(71) Applicant: CARL ZEISS SMT GmbH, Oberkochen (DE)

(72) Inventors: Juergen Mueller, Ulm (DE); Thomas Schicketanz, Aalen (DE); Dirk Heinrich Ehm, Lauchheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 210 days.

(21) Appl. No.: 14/026,486

(22) Filed: Sep. 13, 2013

(65) Prior Publication Data
US 2014/0078481 A1 Mar. 20, 2014

Related U.S. Application Data

(63) Continuation of application No. PCT/EP2012/053234, filed on Feb. 27, 2012.

(60) Provisional application No. 61/452,879, filed on Mar. 15, 2011.

(30) Foreign Application Priority Data

Mar. 15, 2011 (DE) .................. 10 2011 005 543

(51) Int. Cl.
*G03B 27/54* (2006.01)
*G03B 27/32* (2006.01)
(Continued)

(52) U.S. Cl.
CPC ............... *G02B 5/0816* (2013.01); *B82Y 10/00* (2013.01); *G02B 5/0891* (2013.01);
(Continued)

(58) Field of Classification Search
CPC ........................... G02B 27/0025; B82Y 10/00
USPC ................................. 355/67, 77; 359/584, 359
See application file for complete search history.

(56) References Cited

U.S. PATENT DOCUMENTS

| 4,969,175 | A | 11/1990 | Nelson et al. | |
| 7,599,112 | B2 * | 10/2009 | Shiraishi | B82Y 10/00 359/359 |

(Continued)

FOREIGN PATENT DOCUMENTS

| DE | 102009029471 A1 | 3/2011 |
| EP | 1306698 A1 | 5/2003 |

(Continued)

OTHER PUBLICATIONS

International Search Report and Written Opinion in counterpart International Application No. PCT/EP2012/053234, mailed Jul. 30, 2012.

(Continued)

*Primary Examiner* — Hung Henry Nguyen
(74) *Attorney, Agent, or Firm* — Edell, Shapiro & Finnan, LLC

(57) ABSTRACT

A method for correcting a surface form of a mirror (1) for reflecting radiation in the wavelength range of 5-30 nm, which includes:
  applying a correction layer (13) having a layer thickness variation (21) for correcting the mirror's surface form, and
  applying a first group (19) of layers to the correction layer. The first group (19) of layers includes first (9) and second (11) layers arranged alternately one above another, wherein the first layers have a refractive index at the operating wavelength which is greater than the refractive index of the second layers for that radiation.
The correction layer (13) is applied by:
  introducing the mirror into an atmosphere including a reaction gas (15),
  applying a correction radiation (17) having a location-dependent radiation energy density, such that a correction layer having a location-dependent layer thickness variation (21) grows on the mirror's irradiated surface.

11 Claims, 7 Drawing Sheets

(51) Int. Cl.
　　*G02B 5/08*　　　(2006.01)
　　*G02B 27/00*　　(2006.01)
　　*G03F 7/20*　　　(2006.01)
　　*G21K 1/06*　　　(2006.01)
　　*B82Y 10/00*　　(2011.01)

(52) U.S. Cl.
　　CPC ....... *G02B 27/0025* (2013.01); *G03F 7/70191* (2013.01); *G03F 7/70233* (2013.01); *G03F 7/70308* (2013.01); *G03F 7/70958* (2013.01); *G21K 1/062* (2013.01)

(56) References Cited

U.S. PATENT DOCUMENTS

| | | | |
|---|---|---|---|
| 7,804,648 B2 * | 9/2010 | Hosoya | B82Y 10/00 359/584 |
| 2005/0117233 A1 | 6/2005 | Kanazawa et al. | |
| 2005/0271957 A1 | 12/2005 | Miyachi et al. | |
| 2007/0081229 A1 | 4/2007 | Shiraishi | |
| 2007/0091420 A1 | 4/2007 | Hosoya et al. | |
| 2007/0091421 A1 | 4/2007 | Hosoya et al. | |
| 2008/0204861 A1 | 8/2008 | Shiraishi | |
| 2012/0229784 A1 | 9/2012 | Rocktaeschel et al. | |

FOREIGN PATENT DOCUMENTS

| | | |
|---|---|---|
| EP | 1947682 A1 | 7/2008 |
| WO | 2011032813 A1 | 3/2011 |

OTHER PUBLICATIONS

Office Action in corresponding German Application No. 102011005543.6, dated Nov. 28, 2011, along with an English translation.

* cited by examiner

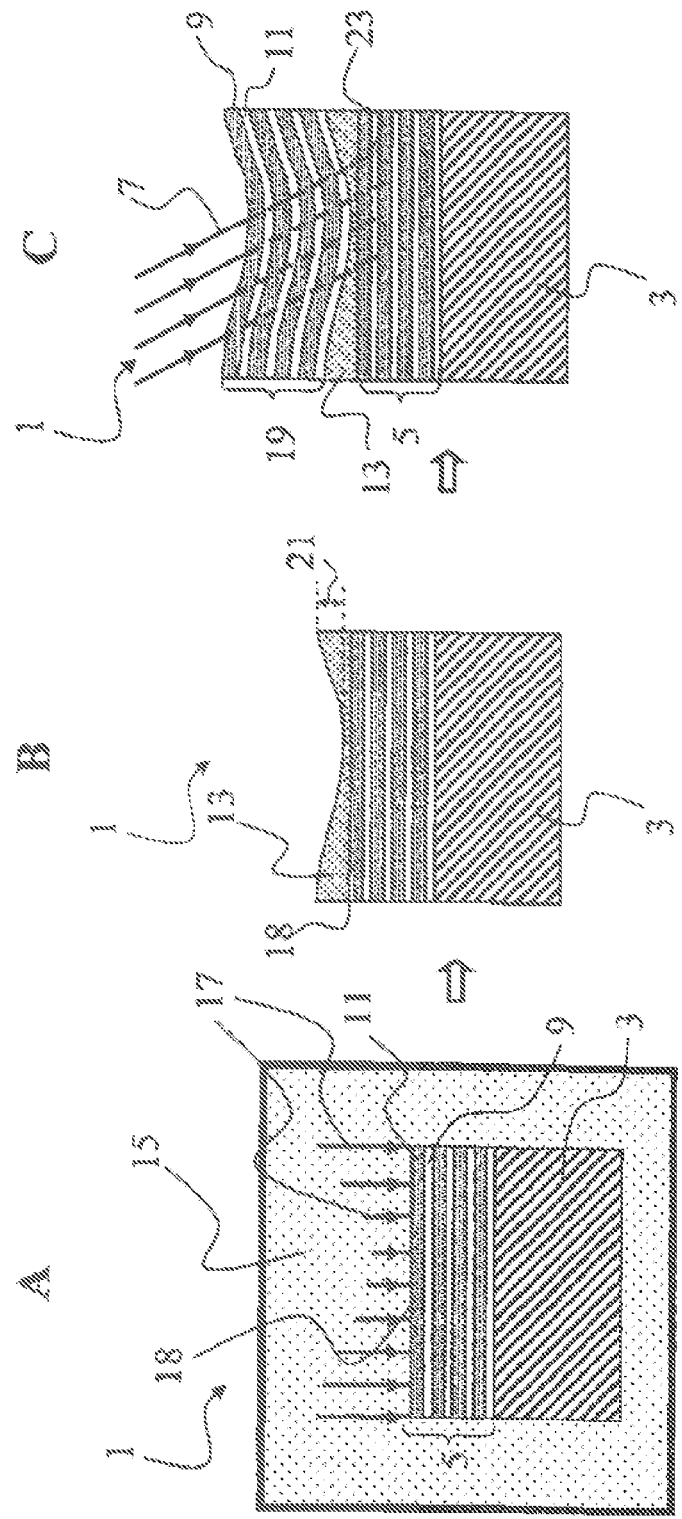

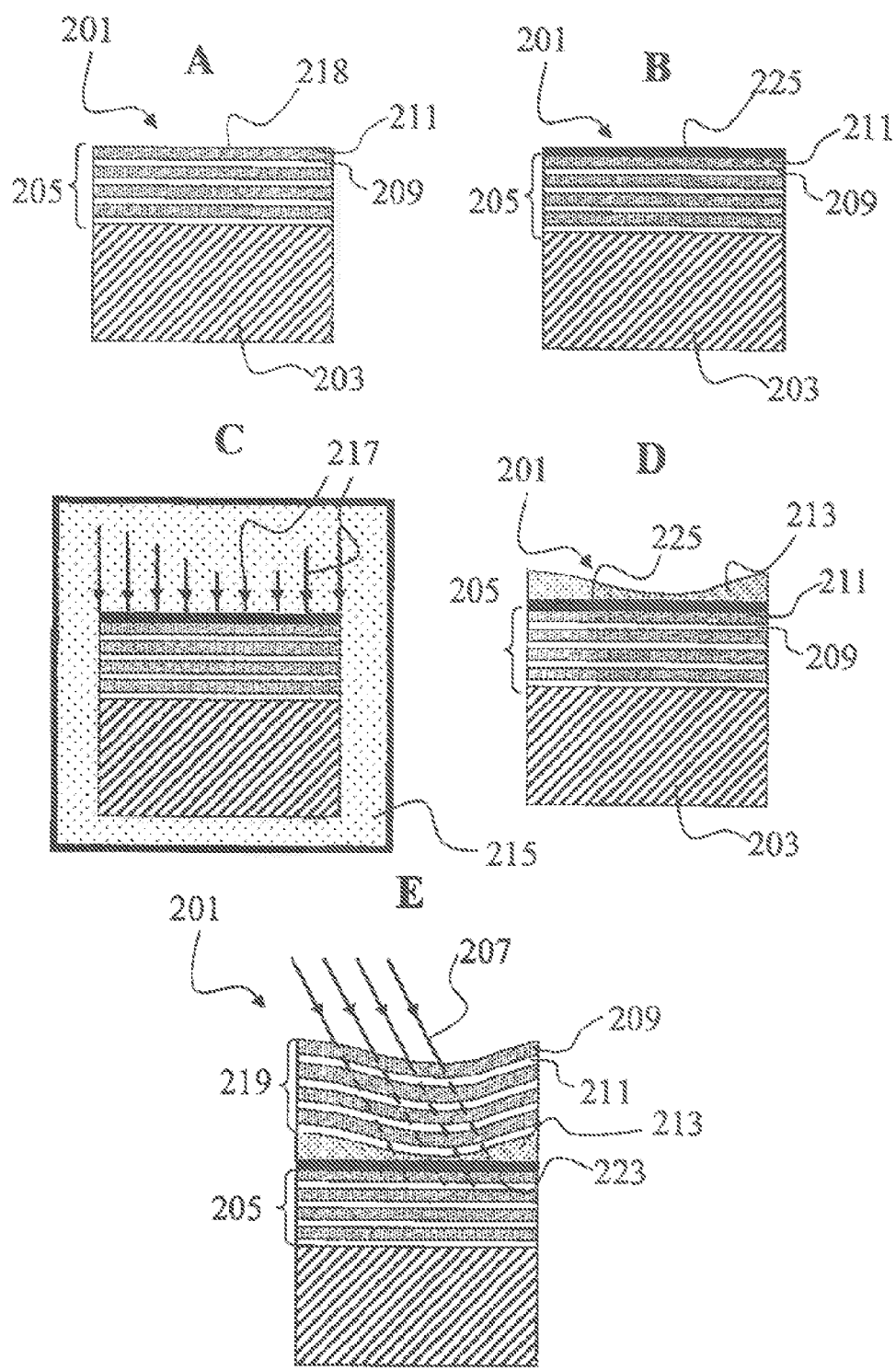

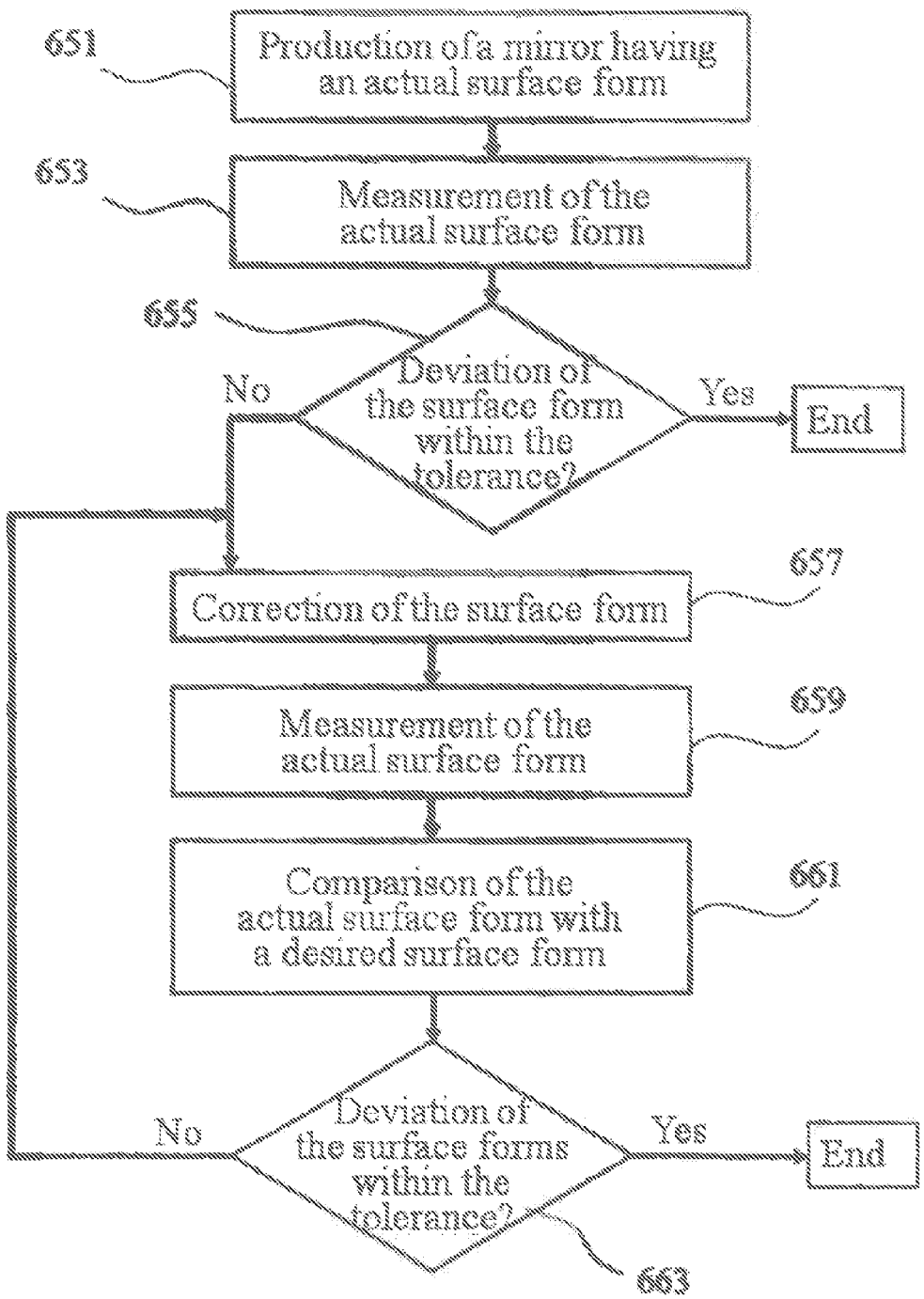

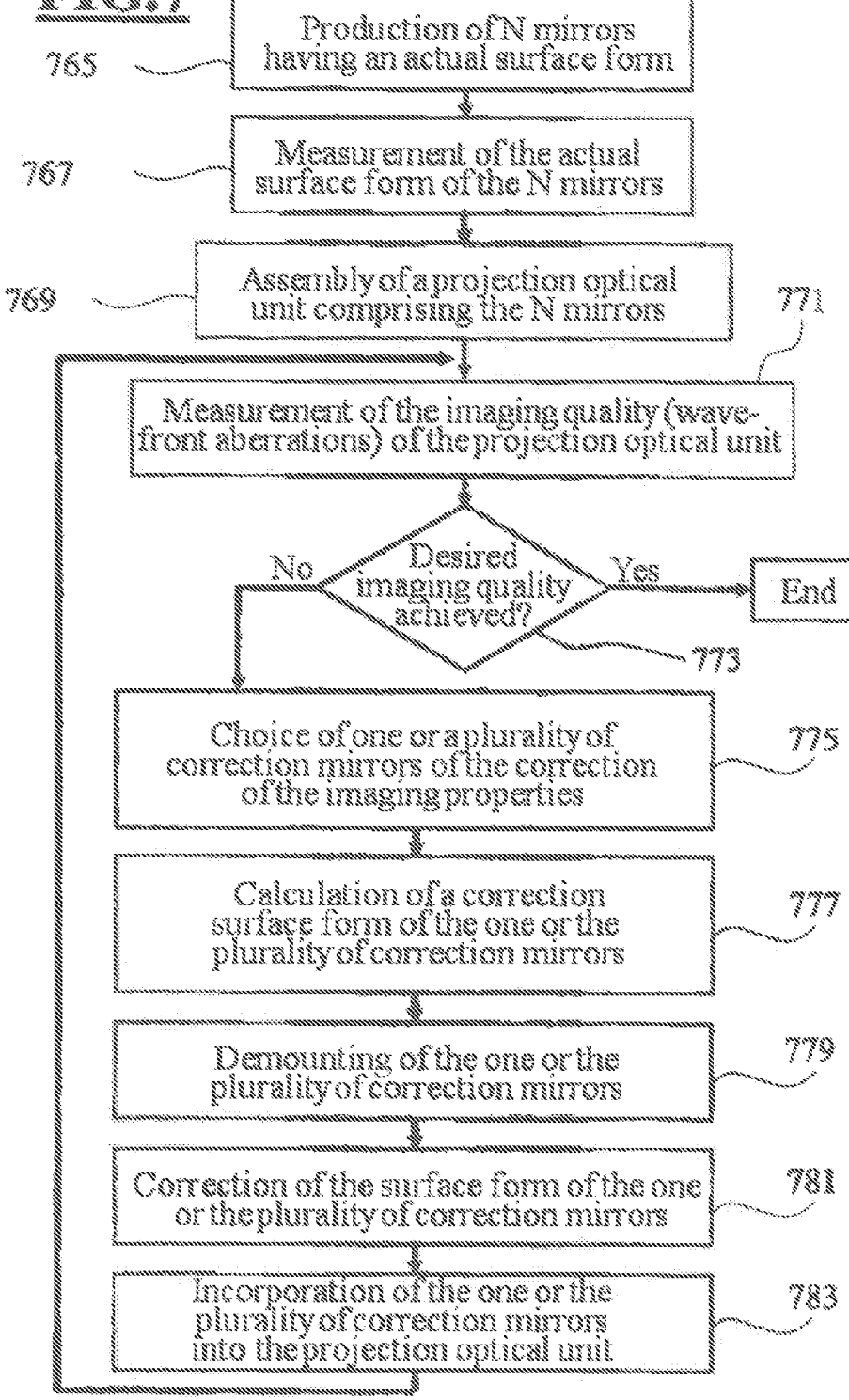

US 9,341,756 B2

METHOD FOR CORRECTING THE SURFACE FORM OF A MIRROR

The present application is a Continuation of International Application No. PCT/EP2012/053234, filed on Feb. 27, 2012, which claims priority of German Patent Application No. 10 2011 005 543.6, filed on Mar. 15, 2011, and U.S. Provisional Application No. 61/452,879, also filed on Mar. 15, 2011. The disclosures of these three applications are hereby incorporated herein by reference in their respective entireties.

FIELD OF AND BACKGROUND OF THE INVENTION

The present invention relates to a mirror for use in a microlithography projection exposure apparatus, a projection lens for use in a microlithography projection exposure apparatus, a microlithography projection exposure apparatus, and also a method for correcting a surface form of a mirror.

Microlithography projection exposure apparatuses serve for producing microstructured components using a photolithographic method. In this case, a structure-bearing mask, the so-called reticle, is imaged onto a photosensitive layer with the aid of a projection optical unit. The minimum feature size that can be imaged with the aid of such a projection optical unit is determined by the wavelength of the imaging light used. The smaller the wavelength of the imaging light used, the smaller the structures that can be imaged with the aid of the projection optical unit. Nowadays, imaging light having an operating wavelength of 193 nm or imaging light having an operating wavelength in the extreme ultraviolet (EUV) range, i.e. 5 nm-30 nm, is principally used. When imaging light having a wavelength of 193 nm is used, both refractive optical elements and reflective optical elements are employed within the microlithography projection exposure apparatus. By contrast, when imaging light having a wavelength in the range of 5 nm-30 nm is used, exclusively reflective optical elements (mirrors) are used.

In order to enable a good imaging of the structure-bearing mask onto the photosensitive layer, it is necessary for the imaging aberrations of the projection optical unit to be reduced as far as possible. Therefore, it is necessary to ensure the surface form of, in particular, the mirrors used within the projection optical unit with a high precision.

OBJECTS AND SUMMARY OF THE INVENTION

An object of the present invention is to provide a mirror having a highly precise surface form and a method for producing such a mirror.

This object is achieved, according to one formulation, by a method for correcting a surface form of a mirror for reflecting radiation having an operating wavelength in the range of 5-30 nm. This mirror has a substrate, and the method includes:
  applying a correction layer having a layer thickness variation for correcting the surface form of the mirror,
  applying a first group of layers to the correction layer, wherein the first group of layers comprises a plurality of first and second layers arranged alternately one above another, wherein the first layers have a refractive index for radiation having the operating wavelength which is greater than the refractive index of the second layers for radiation having the operating wavelength,
wherein applying the correction layer having the layer thickness variation for correcting the surface form of the mirror is effected by:
  introducing the mirror into an atmosphere comprising a reaction gas,
  applying a correction radiation having a location-dependent radiation energy density to the mirror such that a correction layer having a location-dependent layer thickness variation grows on the irradiated surface of the mirror.

What is thereby achieved is that the first group of layers, which brings about the actual reflection, is arranged on a correction layer having an optimum surface form. It is thereby possible for surface aberrations of the mirror to be subsequently corrected.

A group of layers comprising a plurality of first and second layers arranged alternately one above another, wherein the first layers have a refractive index for radiation having the operating wavelength which is greater than the refractive index of the second layers for radiation having the operating wavelength, arises, for example, by using different materials. Thus, by way of example, the first layers can comprise a first material, the refractive index of which for radiation having the operating wavelength is greater than the refractive index of a second material, which the second layers comprise.

First and second layers arranged alternately one above another is understood to mean a layer sequence in which the first and the second layers are arranged in an alternating manner one above another. This does not necessarily include the first and second layers being in contact with one another. By way of example, an auxiliary layer for preventing diffusion can always be arranged between the first and second layers. Periodic layer sequences comprising three or more layers are also possible. Since, in the case of periodic layer sequences of three or more different layers as well, the first layers and the second layers are arranged in an alternating manner one above another, for the purpose of this application such an arrangement is also encompassed by the term "first and second layers arranged alternately one above another".

In the method according to the invention, the process of applying correction radiation to the mirror is effected at the same time as the process of growing the correction layer having a location-dependent layer thickness variation. During this method step, the correction layer is that layer of the mirror which is closest to the surface. The first group of layers is applied to the correction layer after the layer thickness variation of the correction layer has been produced with the aid of the correction radiation.

In comparison with other methods for correcting a surface form, such as, for example, the use of ion beams for material removal, the growth of the correction layer according to the invention leads to a higher surface quality. This is because the surface roughness of a correspondingly growing correction layer is significantly less than the surface roughness of a correction layer whose layer thickness variation has been produced by removal using ion beams. Since a reduced surface roughness of the correction layer leads to an improved reflectivity of the first group of layers for radiation having the operating wavelength, the method according to the invention has the further advantage that the first group of layers has a higher reflectivity than in the case of the use of removing methods for producing the correcting layer thickness variation.

Introducing the mirror into an atmosphere comprising a reaction gas is understood to mean various possibilities for the purposes of this application. Thus, by way of example, a separate mirror can be introduced into a correction apparatus, into which the reaction gas is then conducted. Alternatively, however, it is also possible to correct the mirror in the incorporated state, by the reaction gas being conducted into the optical apparatus comprising the mirror.

In the case of a specific configuration of the method, the mirror, prior to the correction layer being applied, comprises a reflective coating for reflecting radiation having an operating wavelength in the range of 5-30 nm. In this case, said reflective coating contains a second group of layers comprising a plurality of first and second layers arranged alternately one above another.

In this case, the first layers have a refractive index for radiation having the operating wavelength which is greater than the refractive index of the second layers for radiation having the operating wavelength.

This configuration has the advantage that the optical properties of the mirror can be measured highly precisely before the correction method. This is done, for example, by interferometric measurement methods such as are described in EP 1306698 A1. Such measurements are often carried out under conditions which correspond as well as possible to the use conditions of the mirror. This concerns, in particular, the wavelength of the used light for measurement. The exact influence of a mirror on imaging light having a specific operating wavelength can be measured very accurately in particular using light having this wavelength. In the case of measurement using light having a different wavelength, uncertainties can occur, arising from the difference between the measurement wavelength and the operating wavelength. A mirror for reflecting radiation having an operating wavelength in the range of 5-30 nm is therefore often also measured using radiation having the same wavelength. By virtue of the reflective coating, the mirror then also has a reflective effect for this measurement radiation and can be suitably measured. This has the further advantage that the influences of the reflective coating on the surface form, such as introduction of stress, for example, are likewise taken into account in the measurement.

In one embodiment of the method according to the invention, the correction radiation reacts with the atmosphere of the reaction gas in such a way that a deposition of a constituent or of a chemical reaction product of the reaction gas takes place, such that the correction layer grows on account of the deposition. Depending on the reaction mechanism which leads to the growth of the correction layer, different correction radiations are used. In this case, the correction radiation can comprise either an electromagnetic radiation, an ion radiation, an electron radiation or a radiation of chemical radicals. Combinations of the different types of radiation are also possible. The use of electrically neutral radiation, such as electromagnetic radiation or radiation of chemical radicals, has the additional advantage that the radiation can be concentrated onto a very small region. Consequently, a correction radiation having a location-dependent radiation energy density having a very high spatial resolution can be applied to the mirror. A layer thickness variation of the correction layer having a high spatial resolution thus also arises.

The method is often configured in such a way that the deposition is all the greater at a location of the mirror the greater the radiation energy density of the correction radiation at this location of the mirror. It is thereby possible for the layer thickness variation of the correction layer to be set particularly well. However, the opposite case is also possible, in which correction radiation reduces the intensity of the deposition, such that the deposition is all the smaller at a location of the mirror, the larger the radiation energy density of the correction radiation at this location of the mirror.

In specific embodiments of the method, the constituent or the chemical reaction product originates from the following group: carbon, silicon, sulfur, phosphorus, fluorine or organic compounds based on these elements, and inorganic metal compounds, in particular metal hydride compounds.

In one specific embodiment, the correction radiation is an electromagnetic radiation having a wavelength of less than 250 nm, such that photoelectrons are released from an irradiated mirror surface and lead to the dissociation of adsorbed molecules of the reaction gas, such that the correction layer grows on account of a deposition of one of the dissociation products of the reaction gas. At a wavelength of less than 250 nm, the photon energy of the correction radiation is greater than 5 eV, such that photoelectrons having sufficient kinetic energy are released from the irradiated mirror surface in order to bring about dissociation of the molecules.

One example of such a process is the use of a reaction gas comprising hydrocarbons. In this case, the hydrocarbon partial pressure is chosen to be greater than $10^{-12}$ mbar in order to ensure a sufficient growth rate of the correction layer. On account of the correction radiation, photoelectrons are released from the irradiated mirror surface. Said photoelectrons lead to a dissociation of adsorbed hydrocarbon molecules from the reaction gas, with the result that a deposition of carbon takes place. Consequently, a correction layer comprising carbon grows.

In an alternative method, the correction radiation comprises hydrogen radicals which lead to the enrichment of the reaction gas with metal hydride compounds, such that a metallic deposition takes place, as a result of which a correction layer comprising this metal grows. This makes use of the fact that the hydrogen radicals are firstly conducted over a sacrificial metal. At the surface of the sacrificial metal, the hydrogen radicals react to form short-lived metal hydride compounds. At the mirror surface, said metal hydride compounds dissociate and thus produce a metallic deposition on the mirror surface.

In one specific configuration of the method according to the invention, prior to the correction radiation being applied to the mirror, an auxiliary layer is applied to the mirror in order to control a growth rate of the correction layer. Said auxiliary layer thus lies on the surface of the mirror and therefore directly influences the growth process. This has the advantage that the growth rate can be increased in order to achieve a faster correction process. In particular, the correction layer can comprise a material having a catalytic effect during the growth process. Thus, by way of example, some metallic auxiliary layers lead to a high yield of photoelectrons upon irradiation with electromagnetic radiation. This in turn leads to an intensified dissociation of adsorbed molecules of the reaction gas, such that the growth rate of the correction layer is increased. Typical metals for the auxiliary layer are, for example, ruthenium, rhodium, palladium, platinum or iridium.

Known mirrors comprising a reflective coating for reflecting radiation having an operating wavelength in the range of 5-30 nm often have a final coating comprising nitrides, such as $Si_3N_4$, borides, or carbides, such as, for example, SiC or $B_4C$. However, such coatings suppress the deposition of metals from the gas phase. For this reason, it is advantageous firstly to apply a metallic auxiliary layer on the mirror, in order to facilitate the deposition of metals from the gas phase, such as, for example, in the described method with hydrogen radicals and metal hydride compounds.

The process of applying the correction radiation having the location-dependent illumination energy density to the mirror can be effected in various ways. Thus for example by guiding a spatially limited correction radiation beam having a radiation power density over the mirror, such that the location-dependent radiation energy density arises as a result of different residence durations of the correction radiation beam at different locations of the mirror. The correction radiation beam can be a laser radiation beam, in particular. However, corresponding devices for electron beams, ion beams or other material beams are also known to the person skilled in the art. Such scanning of the mirror has the advantage that the location-dependent radiation energy density can be set in a highly variable manner. Thus, different location-dependent radiation energy densities can be applied to different mirrors successively using the same arrangement. This allows flexible use of the correction device for carrying out the method according to the invention.

Alternatively, the location-dependent radiation energy density is applied to the mirror over a large area; this means that different radiation energy densities are present simultaneously at different locations of the mirror. Such irradiation can be achieved with the aid of a diffractive optical element (DOE), for example. With the aid of suitably shaped diffractive optical elements, by way of example, a laser radiation beam can be expanded in such a way that a location-dependent radiation energy density is present at a specific distance from the diffractive optical element.

In a further embodiment, a large-area location-dependent radiation energy density is produced with the aid of a filter element. In this case, the spatially variable transmittance of the filter element prescribes the radiation energy density. Such filter elements can, for example, be arranged near the mirror surface and transmit radiation or alternatively be imaged onto the mirror surface with the aid of an imaging optical unit.

The embodiment comprising filter elements of diffractive optical elements has the advantage that the correction radiation can be applied simultaneously to a larger region, in particular the entire surface to be corrected. This enables the method according to the invention to be carried out more rapidly.

A correction device for carrying out the above-described method according to the invention has the same advantages explained with regard to the method.

The invention furthermore relates to a method for correcting the imaging properties of a projection optical unit of a microlithography projection exposure apparatus comprising an above-described method for correcting a surface form of a mirror of the projection optical unit. Such a method for correcting the imaging properties thus has the advantages described above with regard to the method for correcting a surface form.

The invention additionally relates to a method for correcting the imaging properties of a projection optical unit of a microlithography projection exposure apparatus comprising the following steps:
  a. determining the wavefront aberrations of the projection optical unit,
  b. calculating a correction surface form of at least one mirror from the wavefront aberrations of the projection optical unit,
  c. correcting a surface form of the at least one mirror according to the method described above.

Such a method for correcting the imaging properties has the advantages already described above with regard to the method for correcting a surface form.

The object according to the invention is furthermore achieved, according to another formulation, by a mirror for reflecting radiation having an operating wavelength in the range of 5-30 nm, in particular for use in a microlithography projection exposure apparatus, comprising a substrate and a reflective coating. In this case, the reflective coating comprises a first group of layers and comprises a second group of layers, wherein the second group of layers is arranged between the substrate and the first group of layers. In this case, the first group and the second group of layers respectively comprise a plurality of first and second layers arranged alternately one above another, wherein the first layers have a refractive index for radiation having the operating wavelength which is greater than the refractive index of the second layers for radiation having the operating wavelength. Furthermore, a correction layer having a layer thickness variation for correcting the surface form of the mirror is arranged between the second group and the first group, wherein the correction layer contains at least one of the following constituents: carbon, silicon, sulfur, phosphorus, fluorine or organic compounds based on these elements, and inorganic metal compounds, in particular metal hydride compounds.

Such a mirror arises by firstly providing a mirror substrate with a second group of layers, which serves for reflecting radiation having the operating wavelength, corresponding to the wavelength of the imaging light to be used. The mirror configured in this way is measured in a further step either separately or in the context of an overall measurement of an optical system, wherein radiation having the operating wavelength is used. On the basis of the measurement results obtained, a surface correction is determined and a correction layer having a corresponding layer thickness variation is applied in order to suitably correct the surface form of the mirror. Since this correction often has an adverse influence on the reflectivity of the mirror, in a further step a first group of layers is applied to the correction layer.

The first group of layers and the second group of layers are thus designed for reflecting the same operating wavelength.

Typically, the first group comprises a number of layers which is greater than 20. A reflectivity of the mirror of more than 30% for radiation having the operating wavelength is thereby achieved. In this case, the reflectivity substantially arises as a result of the first group of layers nearer the surface. The number of layers of the first group and the layer thickness of the correction layer are chosen such that a maximum of 10% of the reflected radiation having the operating wavelength arises as a result of reflection at the layers of the second group. Since the layers of the second group are arranged between the substrate and the correction layer, the interfaces of the layers of the second group still have the uncorrected surface form. Therefore, radiation reflected at said interfaces does not contribute optimally to the imaging when the mirror is used.

The first group of layers and the second group of layers both have a plurality of first and second layers arranged alternately one above another, wherein the first layers comprise a first material, the refractive index of which for radiation having the operating wavelength is greater than the refractive index of a second material, which the second layers comprise. This gives rise to the mirror according to the invention having a corrected surface form, wherein the reflectivity of the mirror has not been significantly impaired by the correction of the surface form.

Layer thickness variations for the correction of the surface form are typically approximately of the order of magnitude of an operating wavelength, that is to say at a wavelength of 13.5 nm the layer thickness variation of the surface form lies between 0 nm and 15 nm.

A projection lens comprising a mirror according to the invention and a microlithography projection exposure apparatus comprising such a projection lens have the advantages already explained above with regard to the mirror.

BRIEF DESCRIPTION OF THE DRAWINGS

The invention will be explained in greater detail with reference to the drawings.

FIGS. 1A-C show the method according to the invention for correcting a surface form in a first embodiment.

FIGS. 2A-E show the method according to the invention for correcting a surface form in a further embodiment.

FIG. 5b shows a section through the surface to be corrected that is illustrated in FIG. 5a.

FIG. 6 shows, on the basis of a flowchart, a method for correcting the surface form of a mirror.

FIG. 7 shows, on the basis of a flowchart, a method for correcting the imaging quality of a projection optical unit by the correction of the surface form of a mirror.

DETAILED DESCRIPTION OF PREFERRED EMBODIMENTS

Figure 3A:
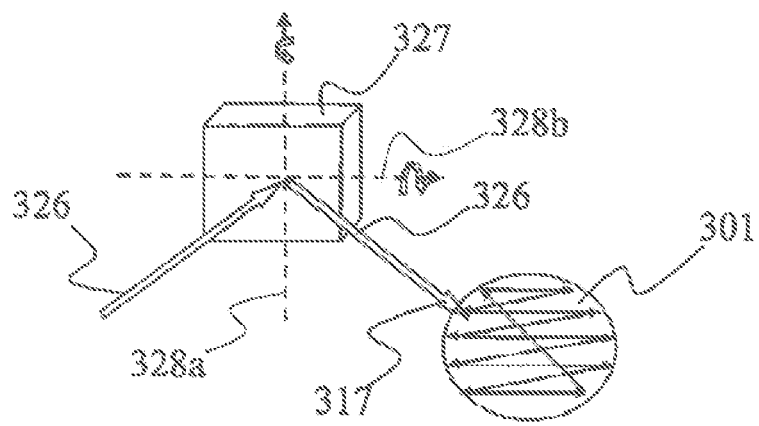
FIGS. 3a, 3b and 3c show different variants for producing a location-dependent radiation energy density.

The reference signs have been chosen such that objects illustrated in FIG. 1 have been provided with single-digit or two-digit numerals. The objects illustrated in the further figures have reference signs having three or more digits, wherein the last two digits indicate the object and the preceding digits indicate the number of the figure in which the object is illustrated. The reference numerals of identical objects illustrated in a plurality of figures therefore correspond in terms of the last two digits. By way of example, the reference signs 1, 201 and 301 designate the mirror in FIGS. 1, 2 and 3.

FIG. 1 shows, on the left-hand side in step A, an embodiment of a mirror 1 for use in a microlithography projection exposure apparatus in an initial state before correction of the surface form. The mirror 1 comprises a substrate 3 and a reflective coating comprising a second group 5 of layers. The substrate 3 can consist of $SiO_2$ (quartz), for example. The second group 5 of layers comprises a plurality of individual layers comprising different materials. The mirror 1 is embodied for reflecting radiation having an operating wavelength in the range of 5 nm-30 nm. Therefore, the second group 5 of layers comprises a plurality of alternating first layers 9 and second layers 11 arranged one above another, wherein the first layers 9 have a refractive index for radiation having the operating wavelength which is greater than the refractive index of the second layers 11 for radiation having the operating wavelength. In this case, this is achieved by the first layers 9 comprising a first material, the refractive index of which for radiation having the operating wavelength is greater than the refractive index of a second material, which the second layers 11 comprise. Typically, silicon is used as first material and molybdenum or ruthenium as second material. Other material combinations such as e.g. molybdenum and beryllium, ruthenium and beryllium or lanthanum and $B_4C$ are likewise possible. In order to achieve a good reflectivity of the mirror, the second group 5 of layers typically comprises more than 20 layers, preferably more than 30 layers. In FIG. 1 and also in the subsequent figures, groups of layers are always indicated just by a few individual layers, for the sake of better clarity. For the purposes of this invention, however, groups of layers are understood to be groups having more than 20 layers, preferably having more than 30 layers. In addition to the layers already described, groups of layers can also comprise intermediate layers for preventing diffusions or covering layers for preventing oxidation and corrosion. A ruthenium covering layer for preventing oxidation and corrosion is often applied, for example, on that side of the second group 5 of layers which is remote from the substrate. The illustration of such auxiliary layers in the figures has been omitted.

In step A, the mirror 1 is situated in an atmosphere comprising a reaction gas 15 and a correction radiation 17 is applied to it. The correction radiation 17 has a location-dependent radiation energy density. This is indicated in FIG. 1 and the subsequent figures by the different lengths of the arrows. The correction radiation 17 then reacts with the atmosphere of the reaction gas 15, such that a deposition of a constituent or of a chemical reaction product of the reaction gas takes place. This results in a correction layer 13 having a location-dependent layer thickness variation 21, which is illustrated in the middle region of FIG. 1 in step B.

One example of such a process is the use of a reaction gas comprising hydrocarbons, thus for example a mixture of volatile and non-volatile hydrocarbons. On account of electromagnetic correction radiation 17, photoelectrons are released from the irradiated mirror surface 18. The wavelength therefore has to be low enough to release photoelectrons. Typically, the work function of photoelectrons is approximately 5 eV, which corresponds to a photon wavelength of 250 nm. The exact value of the work function is dependent on the material at the mirror surface 18. Said photoelectrons lead to a dissociation of adsorbed hydrocarbon molecules from the reaction gas, such that a deposition of carbon takes place. A correction layer 13 comprising carbon thus grows. In this case, the growth rate W of the carbon is linked linearly to the local radiation power density I of the correction radiation 17. Given a simultaneous partial pressure of $10^{-10}$ mbar for the volatile hydrocarbons and of $10^{-12}$ mbar for the non-volatile hydrocarbons and a wavelength of the correction radiation 17 of 13.5 nm, this results in a growth rate:

$$W = c \cdot I \text{ where } c \approx 1 \frac{nm}{hour} \cdot \frac{mm^2}{mW}$$

Given a constant radiation power density of $$1 \frac{mW}{mm^2},$$

a carbon layer having a thickness of 1 nm thus grows per hour. The linear relationship arises since the number of photoelectrons is linked linearly to the number of photons from the correction radiation, and the number of growing carbon atoms is furthermore in turn linked linearly to the number of photoelectrons. The linear relationship between growth rate and radiation power density holds true up to a radiation power density $I_0$ of $$I_0 = 4.5 \cdot 10^{-4} \frac{mW}{mm^2}.$$

At higher radiation power densities, the growth rate does not increase further since, on account of the partial pressures, no further hydrocarbon molecules are available for the process. The radiation power density $I_0$ at which this saturation commences is thus linked to the partial pressures of the hydrocarbons.

The local radiation energy density results from the radiation power density as the temporal integral over the local radiation power density I.

In an alternative method, the correction radiation 13 comprises hydrogen radicals which lead to the enrichment of the reaction gas with metal hydride compounds, such that a metallic deposition takes place, as a result of which a correction layer 13 comprising this metal grows. This makes use of the fact that the hydrogen radicals are firstly conducted over a sacrificial metal. At the surface of the sacrificial metal, the hydrogen radicals react to form short-lived metal hydride compounds. At the mirror surface 18, said metal hydride compounds dissociate and thus produce a metallic deposition on the mirror surface.

In the middle of FIG. 1 in step B, the mirror 1 is illustrated after the growth of the correction layer 13. In this state, although the mirror 1 has a corrected surface form that is better suited to the purposes of beam guiding in a microlithography projection exposure apparatus before the correction processing, the reflectivity of the coating has also been adversely influenced by the additional correction layer 13. Furthermore, the correction layer applied could likewise also itself degrade during the operation of a lithography apparatus as a result of the ambient conditions. In order to rectify this again, a first group of layers 19 is applied, thus resulting in a mirror 1 as in the right-hand part of FIG. 1 under step C. The mirror 1 produced in this way accordingly has a second group 5 of layers and a first group 19 of layers, wherein the second group of layers 5 is arranged between the substrate 3 and the first group 19 of layers. The first group of layers 19 likewise comprises a plurality of alternating first layers 9 and second layers 11 arranged one above another, wherein the first layers 9 have a refractive index for radiation having the operating wavelength which is greater than the refractive index of the second layers 11 for radiation having the operating wavelength. In the first group 19 of layers, too, this is achieved by a suitable choice of materials. Thus, the first layers comprise a first material, the refractive index of which for radiation having the operating wavelength is greater than the refractive index of a second material contained in the second layers 11. The first group 19 of layers comprises more than 20 layers, such that, from the incident radiation 7, a portion 23 which passes through the first group 19 of layers and the correction layer 13 and thus reaches the second group 5 of layers is less than 40% of the intensity of the incident radiation. What can be achieved in this way is that the second group 5 of layers having an uncorrected surface form does not significantly affect the reflectivity properties of the mirror 1. Otherwise, radiation reflected at the second group 5 of layers would have, at least in partial regions, phase relationships such that the optimum phase relationship of the reflected radiation is adversely influenced and a reduction of the intensity of the reflected radiation occurs.

FIG. 2 shows the method according to the invention for correcting a surface form in a further embodiment. Steps A, B, C, D, E are illustrated. Step A shows the mirror 201 in the initial state in an illustration similar to FIG. 1. In contrast to the method illustrated in FIG. 1, in this configuration of the invention, as next step B, an auxiliary layer 225 is applied to the mirror 201. Said auxiliary layer makes it possible to control the growth rate of a correction layer 213. Thus, by way of example, the growth rate can be increased in order to achieve a faster correction process under step C. In particular, the correction layer can comprise a material having a catalytic effect during the growth process. Thus, by way of example, some metallic auxiliary layers 225 lead to a high yield of photoelectrons upon irradiation with electromagnetic correction radiation. This in turn leads to an intensified dissociation of adsorbed molecules of the reaction gas, such that the growth rate of the correction layer 213 is increased. Typical metals for said auxiliary layer 225 are, for example, ruthenium, rhodium, palladium, platinum or iridium.

The use of an auxiliary layer 225 is also advantageous when using hydrogen radicals as correction radiation 217. Known mirrors comprising a reflective coating for reflecting radiation having an operating wavelength in the range of 5-30 nm often have a final coating comprising nitrides, such as $Si_3N_4$, borides, or carbides, such as, for example SiC, or B4C, in order to protect the reflective coating from oxidation and corrosion. However, such coatings suppress the deposition of metals from the gas phase. For this reason, it is advantageous firstly to apply a metallic auxiliary layer 225 on the mirror 201, in order to facilitate the deposition of metals from the gas phase. The following chemical process is utilized in this case: the hydrogen radicals are firstly conducted over a sacrificial metal, wherein the sacrificial metal can be, for example, tin, zinc, indium or lead. Other sacrificial metals are likewise possible. Short-lived metal hydride compounds thereupon arise in the gas phase (e.g. $Sn_xH_y$). At the mirror surface, said metal hydride compounds react with the metallic auxiliary layer 225 for example to form a metal alloy, such that a correction layer 213 comprising a metal alloy grows. By way of example, the process given tin as sacrificial metal and ruthenium in the correction layer 213 appears as follows:

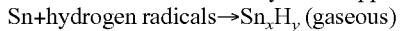
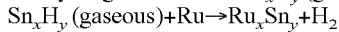

Sn+hydrogen radicals→$Sn_xH_y$ (gaseous)

$Sn_xH_y$ (gaseous)+Ru→$Ru_xSn_y$+$H_2$

After the correction layer 213 has grown in step D, a first group 219 of layers is applied, thus resulting in the mirror illustrated in step E of FIG. 2.

Even though in FIGS. 1 and 2 the mirror 1 in the initial state under step A has a reflective coating comprising a second group 5 of layers, this is nevertheless not necessary for the correction method. Both methods described can also be carried out with a mirror without a second group 5 of layers.

FIG. 3a shows an embodiment for generating a correction radiation 317 having a location-dependent radiation energy density. For this purpose, a spatially delimited correction radiation beam 326, which can be a laser radiation, for example, is directed onto a scanning mirror 327. After reflection at the scanning mirror 327, the correction radiation beam 326 impinges on the mirror 301 at a specific location. By rotating the scanning mirror 327 about two axes 328a and 328b, it is possible to define the exact impingement location of the correction radiation beam 326 on the mirror 301. Since the correction radiation beam 326 has a known radiation power density at the impingement location on the mirror 301, it is possible to produce any desired location-dependent radiation energy density on the mirror 301 by guiding the correction radiation beam 326 over the mirror in a scanning manner. In this case, the location-dependent radiation energy density arises as a result of the different residence durations of the correction radiation beam 326 at different locations of the mirror 301. Thus, different location-dependent radiation energy densities can be applied to different mirrors successively using the same arrangement. This enables flexible use of the correction device for carrying out the method according to the invention. Instead of the use of a scanning mirror 327, other known scanning devices can also be used. This is important particularly when particle radiation is used as correction radiation 317. Thus, by way of example, corresponding nozzles can be moved in a scanning manner.

Alternatively, in the case of charged particles, it is also possible to use suitably controlled electric and magnetic fields for deflecting the particle radiation.

Figure 3B:
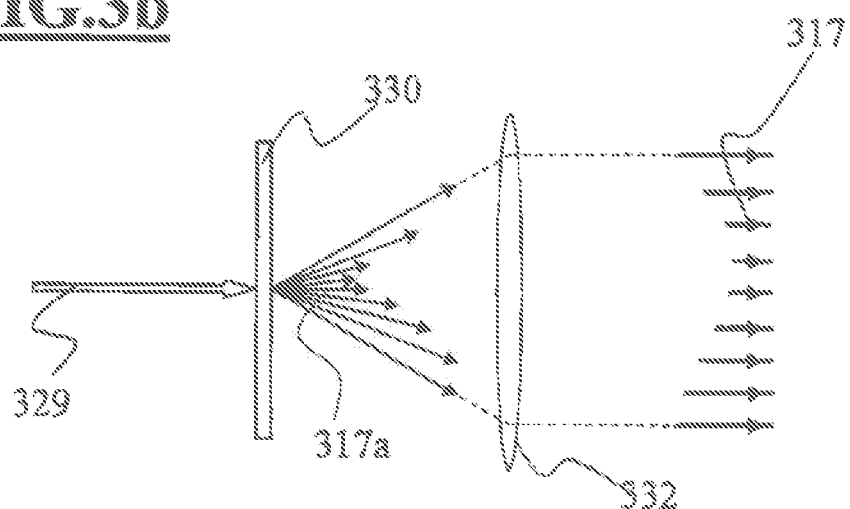

FIG. 3b shows an alternative embodiment for generating a correction radiation 317 having a location-dependent radiation energy density. In this embodiment, a laser radiation beam 329 is directed onto a diffractive optical element (DOE) 330. The diffractive optical element 330 has a predetermined emission characteristic and generates an expanded correction radiation beam 317a having an angle-dependent radiation energy density. This is illustrated schematically by the different lengths of the arrows in FIG. 3b. By choosing the distance between diffractive optical element and mirror and/or by using a further optical unit, which is indicated schematically by the lens element 332 in FIG. 3b, the angle-dependent radiation energy density is converted into a location-dependent radiation energy density of the correction radiation 317.

Figure 3C:
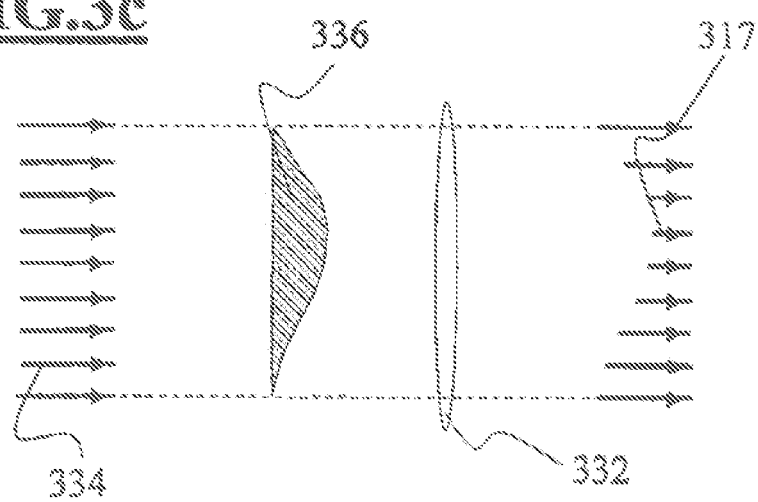

FIG. 3c shows a further embodiment for generating a correction radiation 317 having a location-dependent radiation energy density. In this embodiment, the large-area location-dependent radiation energy density of the correction radiation 317 is generated with the aid of a filter element. While the initial radiation 334 has no location dependence, after passing through the filter element 336 a location-dependent radiation energy density arises on account of the locally different transmittance of the filter element 336. In this case, the transmittance is indicated by the thickness of the filter element 336 in the beam direction in FIG. 3c. Instead of a locally variable thickness, it is also possible to employ different materials in the filter element 336 for generating the locally different transmittance. Such filter elements can either be arranged and transmit radiation near the surface of the mirror 301 or alternatively be imaged onto the mirror surface with the aid of an imaging optical unit, indicated by the lens 332.

Figure 4:
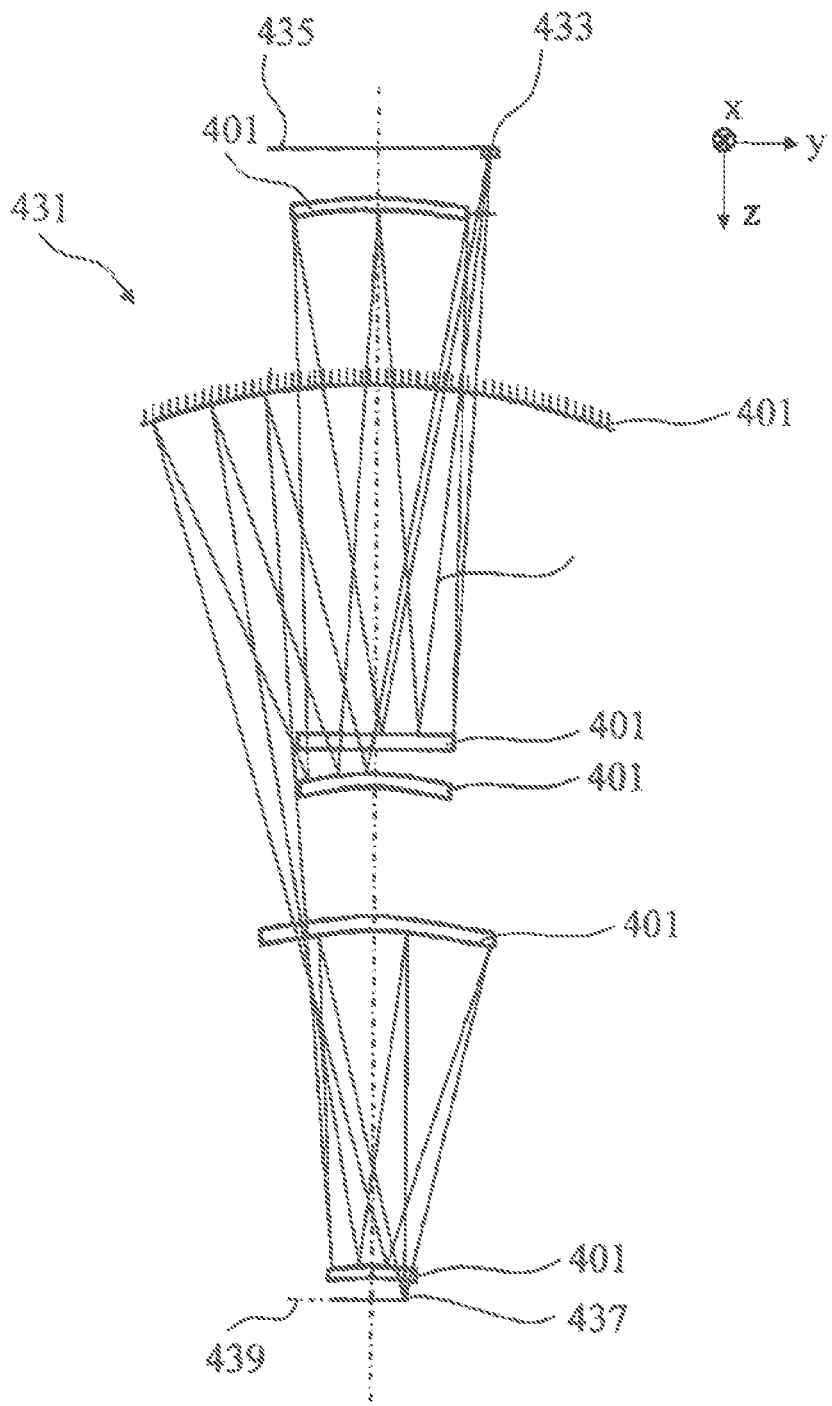
FIG. 4 shows an exemplary projection optical unit in which a mirror according to the invention can be employed.

FIG. 4 illustrates an exemplary embodiment of a projection optical unit 431. With the aid of the projection optical unit 431, a structure-bearing mask 433 arranged in an object plane 435 is imaged onto an image 437 in an image plane 439. A photosensitive layer that changes chemically as a result of the exposure is arranged in the image plane 439. This is referred to as a so-called lithographic step. In the present exemplary embodiment, the projection optical unit 431 comprises six mirrors 401 used for imaging the structure-bearing mask 433 into the image plane 439. Such a projection lens 431 is usually diffraction-limited, such that the maximum possible resolution can be achieved only when the wavefront aberrations of the projection optical unit are sufficiently small. In the case of diffraction-limited projection optical units it is necessary for the RMS value (root mean square) to be less than $1/14$ of the operating wavelength. In order to achieve this, the surface form of the mirrors 401 has to be set highly precisely. Furthermore, the mirrors 401 likewise have to be positioned very exactly.

In addition to projection optical units which comprise only mirrors as optical components, as in the embodiment illustrated, the invention can also be employed in the case of so-called catadioptric projection lenses. Catadioptric projection lenses contain both reflective and refractive optical elements. Projection lenses of this type are usually used if the imaging light has an operating wavelength in the range of 193 nm or 248 nm.

Figure 5A:
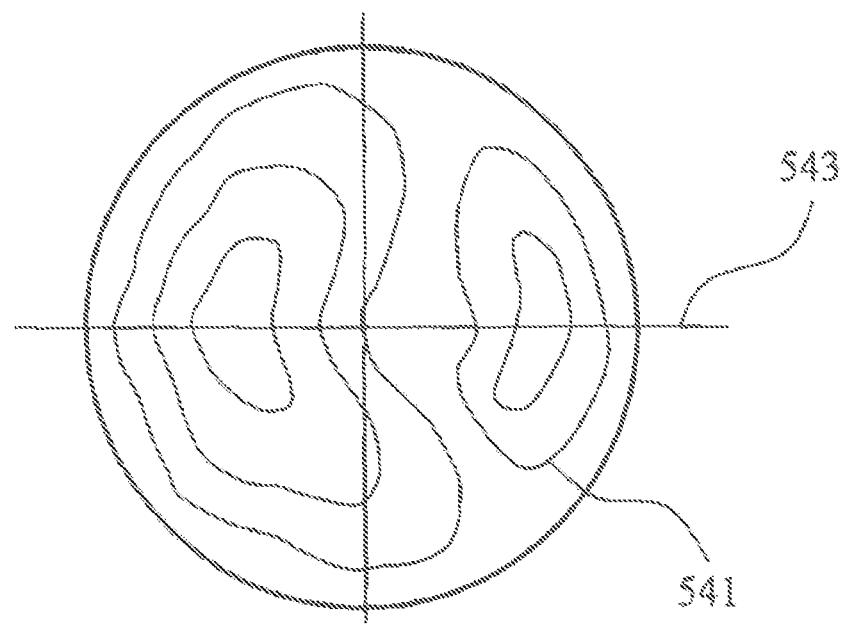
FIG. 5a schematically shows a plan view of a surface to be corrected.
Figure 5B:
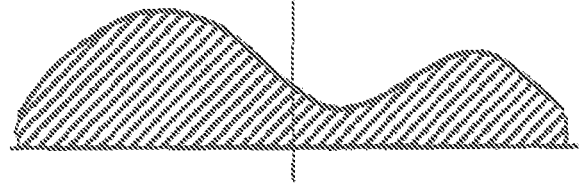

FIG. 5 shows, by way of example, the surface form to be corrected of a mirror. The deviation between the actual surface form and the desired surface form is illustrated with the aid of the contour lines 541 in FIG. 5a. Furthermore, FIG. 5b shows the height profile of this deviation along the line 543 in FIG. 5a. Such deviations shown can be determined e.g. with the aid of an interferometric measurement method, as explained in EP 1306698.

FIG. 6 illustrates a method according to the invention for correcting a surface form of a mirror by way of example on the basis of a flow chart. Firstly, in step 651, a mirror having an actual surface form is produced. This mirror then already comprises a substrate and a reflective coating comprising a second group of layers. Afterward, in step 653, the actual surface form of the mirror is accurately measured. An interferometric measurement method such as is described e.g. in EP 1306698 A1 is usually used for this purpose. In step 655, the measured actual surface form is then compared with the desired surface form sought. If the two surface forms correspond within the desired tolerance, then the method is already concluded. If a deviation of the surface form which lies outside the tolerance is present, then a correction of the surface form is performed next in step 657. This method step 657 comprises the steps elucidated in FIGS. 1-3, that is to say applying a correction layer having a location-dependent layer thickness variation for correcting the surface form and applying a further group of layers. After this correction of the surface form, the actual surface form is measured again in step 659. In step 661, this actual surface form is then compared again with the desired surface form. In method step 663, a check is then made to determine whether the actual surface form now corresponds to the desired surface form within the tolerance. If the result is positive, then the method is concluded at this point. If a deviation outside the tolerance still results, then the method is continued again with the correction of the surface form in step 657. Depending on the magnitude of the deviation to be corrected between actual surface form and desired surface form, repeated application of this described correction loop of steps 657, 659, 661 and 663 may be necessary. In contrast to other methods for correcting a surface form of a mirror such as are known from the prior art, the method according to the invention does not necessarily have a method step in which an entire layer is removed. The method can therefore be carried out particularly rapidly and cost-effectively. However, as an alternative, it is also possible to supplement the method by such a step, if e.g. damage to the reflective coating has occurred.

FIG. 7 illustrates the method according to the invention for correcting the imaging properties of a projection optical unit of a microlithography projection exposure apparatus on the basis of a flow chart. In a first step 765, a plurality N of mirrors which are required for the projection optical unit are produced. On account of the production accuracy, these N mirrors have an actual surface form that can deviate from the desired surface form sought. In an optional step 767, the present actual surface form of the N mirrors is measured with the aid of an interferometric measurement method. It becomes clear from the further method that an exact knowledge of the actual surface form of all N mirrors is not absolutely necessary for carrying out the method if the deviation of the actual surface form from the desired surface form sought is not all that large. Therefore, step 767 can be dispensed with, if appropriate.

In the next step 769, a projection optical unit is assembled from the N mirrors. The imaging properties of the projection optical unit are then measured in step 771. The wavefront aberrations of the entire projection lens are measured in this step 771. This is likewise done with the aid of interferometric measurement methods, such as, for example, by using the methods described in EP 1306698 A1. In method step 773, a check is then made to determine whether the wavefront aberrations of the projection optical unit are sufficiently small. For a good imaging quality of the projection optical unit it is necessary for the RMS value of the wavefront aberrations to be less than 1/14 of the operating wavelength. If the wavefront aberrations are already sufficiently small, then the method is concluded at this point.

Otherwise, it is necessary to perform a correction on the projection optical unit. In addition to altering the position of individual mirrors within the projection optical unit, it is possible to perform a correction of the wavefront aberrations by correcting the surface form of one or more mirrors of the projection optical unit. In this case, it is not absolutely necessary for a correction of the surface form of all mirrors of the projection optical unit to be carried out. Depending on the specific optical design of the projection optical unit it may suffice if a correction of the surface form is carried out on a few, in particular only on one, of the mirrors. From the optical design of the projection optical unit it is possible to determine, for example, how the wavefront aberrations of the projection optical unit change if the surface form of a specific mirror is altered. It may emerge, for example, that, in the case of a first mirror, only a small change in the surface form is necessary for the correction of the wavefront aberrations, whereas a much greater change in the surface form is necessary in the case of a different, second mirror. Furthermore, specific profiles of the wavefront aberrations of the projection optical unit can be corrected only with the aid of the alteration of the surface form of mirrors which have a specific position within the imaging beam path of the projection optical unit. For this reason, the next step 775 involves making a suitable choice of correction mirrors which are particularly suitable for bringing about a correction of the wavefront aberration by altering the surface form. In step 777 a correction surface form is then calculated for this choice of correction mirrors with the aid of the measured wavefront aberrations and the optical design of the projection optical unit. If the actual surface form of all N mirrors has been measured in a step 767 and the exact position of all N mirrors is known, the surface form of the correction mirrors can be calculated absolutely. If a measurement of the actual surface form in step 767 has been dispensed with, then only a required relative change in the surface form of the correction mirrors can be determined from the wavefront aberrations and the optical design. Both cases are combined below under the term correction surface form. A correction surface form can therefore be understood to mean an absolute surface form of the correction mirror or else the required relative change in the surface form of the correction mirror. It is often simpler to calculate only the required change in the surface form since the absolute actual surface form and position of all the mirrors are not necessarily known exactly enough. Therefore, only the necessary difference with respect to the possibly unknown actual surface form is calculated. Step 779 consists in the demounting of the one or the plurality of correction mirrors chosen in the previous steps. Step 779 is an optional step. According to the invention, it is also possible to correct a mirror in the incorporated state, by conducting the reaction gas into the projection optical unit comprising the mirror. In this case, step 779 can be dispensed with. In the subsequent steps, the correction radiation is then applied to the incorporated mirror. Next, in step 781, a correction of the surface form of the one or the plurality of correction mirrors is carried out with the aid of the calculated correction surface form. In this case, the correction of the surface form of the one or the plurality of correction mirrors is effected with the aid of a correction method such as has been described with reference to FIGS. 1-3.

In the next step 783, the correction mirrors thus treated, if they were previously demounted are incorporated into the projection optical unit again. The imaging quality of the projection optical unit can then be determined again in method step 771. Afterward, in method step 773, a check is made to determine whether the measured wavefront aberrations are sufficiently small, such that a sufficient imaging quality is ensured. If this is the case, then the method according to the invention is concluded at this point. Otherwise, a further correction loop comprising step 775, 777, 779, 781 and 783 is carried out. On account of the stringent requirements in respect of the wavefront aberrations of the projection optical unit, it may be necessary that the correction loop described has to be carried out repeatedly until a sufficient imaging quality is achieved.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A method for correcting a surface form of a mirror for reflecting radiation having an operating wavelength in the range of 5-30 nm,
   wherein the mirror comprises a substrate,
   wherein the method comprises:
      applying a correction layer having a layer thickness variation for correcting the surface form of the mirror, and
      applying a first group of layers to the correction layer, wherein the first group of layers comprises a plurality of first and second layers arranged alternately one above another, wherein the first layers have a refractive index for radiation having the operating wavelength which is greater than a refractive index of the second layers for radiation having the operating wavelength,
   wherein applying the correction layer having the layer thickness variation for correcting the surface form of the mirror comprises:
      introducing the mirror into an atmosphere comprising a reaction gas,
      applying a correction radiation having a location-dependent radiation energy density to the mirror such that a correction layer having a location-dependent layer thickness variation grows on the irradiated surface of the mirror.

2. The method according to claim 1, wherein
   the mirror, prior to the correction layer being applied, comprises a reflective coating for reflecting radiation having an operating wavelength in the range of 5-30 nm,
   wherein the reflective coating comprises a second group of layers, wherein the second group of layers comprises a plurality of first and second layers arranged alternately one above another,
   and wherein the first layers have a refractive index for radiation having the operating wavelength which is greater than a refractive index of the second layers for radiation having the operating wavelength.

3. The method according to claim 1, wherein
   the correction radiation reacts with the atmosphere of the reaction gas such that at least one of a constituent of and a chemical reaction product of the reaction gas is deposited on the irradiated surface of the mirror, such that the correction layer grows in response to the deposition.

4. The method according to claim 3, wherein the deposition is proportional to the radiation energy density of the correction radiation at various locations on the irradiated surface of the mirror.

5. The method according to claim 3, wherein the correction radiation comprises at least one of an electromagnetic radiation, an ion radiation, an electron radiation and a radiation of chemical radicals.

6. The method according to claim 3, wherein the constituent or the chemical reaction product originates from a group consisting of:
carbon, silicon, sulfur, phosphorus, fluorine or organic compounds based on these elements, and inorganic metal compounds.

7. The method according to claim 1, wherein the correction radiation is an electromagnetic radiation having a wavelength of less than 250 nm, such that photoelectrons are released from an irradiated mirror surface and lead to a dissociation of adsorbed molecules of the reaction gas, such that the correction layer grows in accordance with a deposition of at least one of the dissociation products of the reaction gas.

8. The method according to claim 1, wherein the correction radiation comprises hydrogen radicals which lead to an enrichment of the reaction gas with metal hydride compounds, such that the metal is deposited and the correction layer comprising the metal grows on the irradiated surface of the mirror.

9. The method according to claim 1, further comprising, prior to the correction radiation being applied to the mirror, applying an auxiliary layer to the mirror to control a growth rate of the correction layer.

10. A method for correcting imaging properties of a projection optical unit of a microlithography projection exposure apparatus, comprising a method for correcting a surface form of a mirror of the projection optical unit as claimed in claim 1.

11. A method for correcting imaging properties of a projection optical unit of a microlithography projection exposure apparatus comprising:
   a. determining wavefront aberrations of the projection optical unit,
   b. calculating a correction surface form of at least one mirror from the wavefront aberrations of the projection optical unit, and
   c. correcting a surface form of the at least one mirror according to the method claimed in claim 1.

\* \* \* \* \*